(12) United States Patent
Köyer et al.

(10) Patent No.: US 9,975,157 B2
(45) Date of Patent: May 22, 2018

(54) PROCESS AND APPARATUS FOR PRODUCING PROFILES FROM METAL

(71) Applicants: THYSSENKRUPP STEEL EUROPE AG, Dortmund (DE); THYSSENKRUPP AG, Essen (DE)

(72) Inventors: Maria Köyer, Dortmund (DE); Sascha Sikora, Lünen (DE); Jens Plha, Düsseldorf (DE)

(73) Assignee: THYSSENKRUPP AG, Essen (DE)

(*) Notice: Subject to any disclaimer, the term of this patent is extended or adjusted under 35 U.S.C. 154(b) by 98 days.

(21) Appl. No.: 14/755,851

(22) Filed: Jun. 30, 2015

(65) Prior Publication Data
US 2016/0001338 A1 Jan. 7, 2016

(30) Foreign Application Priority Data

Jul. 3, 2014 (DE) .......... 10 2014 109 315

(51) Int. Cl.
| | |
|---|---|
| B21B 1/22 | (2006.01) |
| B21D 5/08 | (2006.01) |
| C23C 14/22 | (2006.01) |
| C23C 16/50 | (2006.01) |
| C25D 7/00 | (2006.01) |

(Continued)

(52) U.S. Cl.
CPC .............. *B21B 1/22* (2013.01); *B21D 5/008* (2013.01); *B21D 5/08* (2013.01); *C21D 1/34* (2013.01); *C21D 1/673* (2013.01); *C21D 9/46* (2013.01); *C23C 14/22* (2013.01); *C23C 16/50* (2013.01); *C25D 7/00* (2013.01); *B21B 45/004* (2013.01); *C21D 1/02* (2013.01); *C21D 2221/00* (2013.01)

(58) Field of Classification Search
CPC .. B21B 1/22; B21D 5/08; B21D 5/008; C21D 8/0284; C21D 8/0294
See application file for complete search history.

(56) References Cited

U.S. PATENT DOCUMENTS 3,431,624 A * 3/1969 Pickel ................. B21D 53/645
148/508
3,530,569 A * 9/1970 Wilson, Jr. ................ B21B 9/00
106/14.26

(Continued)

FOREIGN PATENT DOCUMENTS

| CN | 101400819 A | 4/2009 |
|---|---|---|
| CN | 101454464 A | 6/2009 |

(Continued)

*Primary Examiner* — Teresa M Ekiert
(74) *Attorney, Agent, or Firm* — RMCK Law Group PLC

(57) ABSTRACT

The present disclosure relates to a process for producing profiles from metal, a metallic strip material being fed to a shaping-hardening device, in which the strip material is shaped into a profile and is hardened at least in certain regions, portions of the profile that are emerging continuously from the shaping-hardening device being coated with a protective layer. The disclosure also relates to an apparatus for producing profiles from metal, with a shaping-hardening device for shaping a metallic strip material that can be fed to the shaping-hardening device into a profile and for hardening the profile at least in certain regions, and with a coating device, by which portions of the profile that are emerging continuously from the shaping-hardening device can be coated with a protective layer.

13 Claims, 1 Drawing Sheet

(51) Int. Cl.
*B21D 5/00* (2006.01)
*C21D 9/46* (2006.01)
*C21D 1/34* (2006.01)
*C21D 1/673* (2006.01)
*B21B 45/00* (2006.01)
*C21D 1/02* (2006.01)

(56) References Cited

U.S. PATENT DOCUMENTS 8,522,586 B2 * 9/2013 Faderl .................. C23C 2/02
 118/63
2009/0308503 A1 * 12/2009 Tyl ...................... C21D 1/63
 148/595

FOREIGN PATENT DOCUMENTS

| DE | 10120063 C2 | 3/2003 |
| DE | 102004016524 A1 | 10/2005 |
| DE | 102011000074 A1 | 7/2012 |
| EP | 1462192 A1 | 9/2004 |

* cited by examiner

PROCESS AND APPARATUS FOR PRODUCING PROFILES FROM METAL

CROSS REFERENCE TO RELATED APPLICATIONS

This application claims priority to German Application No. 102014109315.1 filed on Jul. 3, 2014. The disclosure of the above application is incorporated herein by reference in its entirety.

FIELD

The present disclosure relates to a process for producing profiles from metal, a metallic strip material being fed to a shaping-hardening device, in which the strip material is shaped into a profile and is hardened at least in certain regions. The disclosure also relates to an apparatus for producing profiles from metal, with a shaping-hardening device for shaping a metallic strip material that can be fed to the shaping-hardening device into a profile and for hardening the profile at least in certain regions.

BACKGROUND

Such devices and processes for producing metallic profiles, such as for example steel profiles, are used for example in the area of motor vehicle construction, in order to produce structural or safety parts that are completely or locally hardened.

For example, DE 101 20 063 A1 discloses a process for producing profiles from steel, a strip material being fed to a rolling-profiling device, in which it is shaped into a profile. During the shaping process or after the shaping process, the profile is hardened by a heat treatment and subsequent quenching. Since the rolling-profiling and the hardening are carried out in a shaping-hardening device in a continuous process, this process allows efficient and cost-effective production of hardened profiles for motor vehicle construction that are cut to length into individual profiled components in a cutting-to-length unit following the shaping-hardening device. However, it has been found to be disadvantageous that the profiles or the profiled components are only protected inadequately from corrosion.

SUMMARY

Against this background, the object of the present disclosure is to make low-cost corrosion protection possible.

The object is achieved by a process for producing profiles from metal, a metallic strip material being fed to a shaping-hardening device, in which the strip material is shaped into a profile and is hardened at least in certain regions, and portions of the profile that are emerging continuously from the shaping-hardening device being coated with a protective layer.

By applying a protective layer to the hardened profile, the profile can be protected from corrosion. The coating is applied to the profile emerging continuously from the shaping-hardening unit, so that it is not necessary first to cut the profile to length into individual profiled components and then to coat the profiled components individually. Consequently, the process makes low-cost corrosion protection possible.

It is preferred that a first portion of the profile is coated in a coating device while a second portion of the profile is in the shaping-hardening device, so that the coating of the profile is performed with a continuous material flow through the shaping-hardening device and the coating device. As a result, a particularly efficient and economical production process with continuous passage can be made possible.

It is advantageous if the profile is coated coherently, so that the profile is completely coated with a protective layer. A continuous protective layer has the effect that continuous protection of the profile from corrosion can be made possible. It is preferred that the profile is continuously coated in such a way that cut edges of the profile are coated, whereby the ease of handling the profile is improved.

Alternatively, it may be provided that the profile is coated incoherently, so that the profile has both coated portions and uncoated portions. For example, it is possible to provide only regions that are particularly at risk of corrosion, in particular wet regions of the profile, with a coating. Furthermore, the profile may be coated incoherently in such a way that only the cut edges of the profile are coated with a protective layer.

It is preferred that the thickness of the protective layer is varied from portion to portion, whereby portions of the profile with a protective coating of differing thickness can be created. For example, regions that are particularly at risk of corrosion may be coated with a thicker protective layer than those regions that are less at risk of corrosion.

An advantageous refinement of the process provides that the profile is coated by depositing or spraying on the protective layer. The protective layer may protect the profile from corrosion passively or actively. Suitable coating processes are depositing from a plasma by means of physical or chemical gas phase deposition or electrolytic deposition (electroplating), in particular of zinc, aluminium or a zinc-nickel protective layer. Also suitable is flame spraying or the application of zinc flakes by a spraying process, Cr(VI)-free zinc flake coatings preferably being used. Alternatively, a lacquer may be applied as the protective layer. Furthermore, it is possible to apply a protective layer formed as a zinc alloy, for example Zn—Mn, Zn—Cu, Zn—Fe—Ni or Zn—Cu—Ni. All of these coating processes have the common feature that it is not necessary to alloy the profile to achieve the effect of protection from corrosion. It may optionally be provided that the profile is nitrided before or during the coating, so that an increase in the surface hardness can be achieved. Furthermore, it is possible to oxidize the profile before or during the coating, in order to form an oxide layer, which again increases the corrosion protection.

It is advantageous if the portions of the profile that are emerging from the shaping-hardening device are cleaned before the coating. By cleaning the profile, improved adherence of the protective layer can be made possible. The cleaning may be performed in particular mechanically and/or chemically. For mechanical cleaning, a blasting process with a jet of water and/or air and/or material may be used, or a process in which the profile is brushed. Alternatively or in addition, chemical cleaning may be performed with an alkaline cleaner which comprises alkali hydroxides, alkali carbonates, phosphates, borax, silicates and/or cyanides. For the chemical cleaning, surface-active substances, such as for example surfactants or emulsifiers, and/or inhibitors may be additionally used.

A preferred embodiment provides that the temperature of the profile is adjusted to above 25° C. before the coating. By adjusting the temperature of the profile, in particular heating it up, the adherence of the protective layer can be improved and/or the working time required for the coating can be shortened. In order to avoid a reduction in the hardness of the profile or in the tensile strength of the profile, it is particularly preferred that the temperature of the profile is adjusted to the range between 25° C. and 300° C.

It is also advantageous if the profile is dried and/or heated after the coating, so that the adherence of the protective layer to the profile is again improved.

It has proven to be advantageous if the strip material is shaped into a profile in the shaping-hardening device by a profiling roller. The use of a profiling roller has the effect that the shaping of the strip material into a profile can be performed with a high material throughput, whereby low-cost production of profiles is made possible.

It is advantageous if the profile is hardened in the shaping-hardening device during or after the shaping, so that a continuous run of material through the shaping-hardening device is possible. The metal of the strip material and/or of the profile may be heated to a temperature required for the hardening during the shaping. Alternatively, it is possible to heat the profile after the shaping. Subsequently, the profile may be quenched in the shaping-hardening device. It is preferred that the profile is hardened in certain regions, so that it has regions with differing degrees of hardness.

It has proven to be particularly advantageous in this connection if, for the hardening, the profile is heated inductively, conductively, with a naked flame or by contact heat. In the case of conductive heating or heating by contact heat, heat can be transferred to the profile by way of a profiling roller.

A preferred embodiment provides that the profile is cut to length into individual profiled components after the coating. The fact that the profile is first coated and then cut to length after the coating means that it is possible to produce individual, coated profiled components in a continuous run-through process.

Also proposed to achieve the object mentioned at the beginning is an apparatus for producing profiles from metal that has a shaping-hardening device for shaping a metallic strip material that can be fed to the shaping-hardening device into a profile and for hardening the profile at least in certain regions, the apparatus comprising a coating device, by which portions of the profile that are emerging continuously from the shaping-hardening device can be coated with a protective layer.

The same advantages as already described in connection with the process according to the disclosure are obtained in the case of the apparatus for producing profiles from metal.

An advantageous embodiment provides that the shaping-hardening device and the coating device are arranged one behind the other in such a way that the profile can be conveyed through the shaping-hardening device and the coating device in the manner of an assembly-line process and thereby coated continuously, so that the production of a corrosion-protected profile in a continuous run-through process is made possible.

The advantageous features described in connection with the production process can be used individually or in combination in the case of the apparatus for producing profiles from metal.

DETAILED DESCRIPTION

In the various figures, the same parts are always provided with the same reference, and are therefore in each case also generally only referred to or mentioned once.

Figure 1:
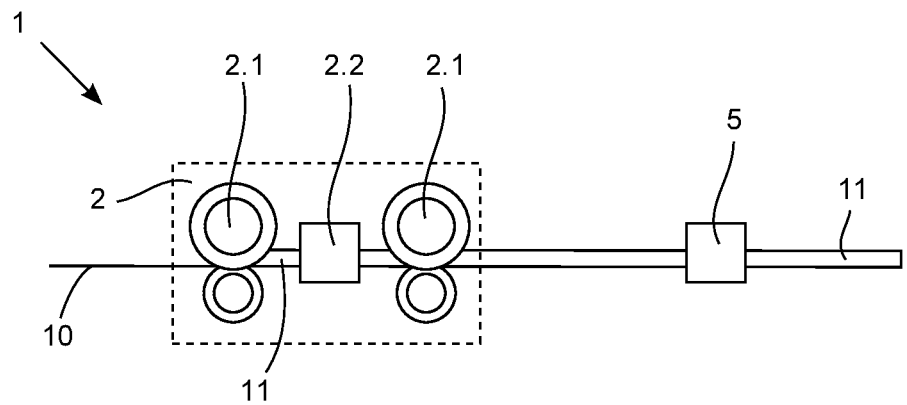
FIG. 1 shows a first exemplary embodiment of an apparatus according to the disclosure for producing profiles from metal.

In FIG. 1 there is shown an apparatus for producing profiles 11 from metal, by means of which structural and/or safety parts for automobile construction are produced. The apparatus 1 has a shaping-hardening device 2, to which a starting material in the form of strip material 10, in particular as hot strip or cold strip, preferably a manganese-boron steel, is fed. The starting material is an uncoated steel material. In the shaping-hardening device 2, the strip material 10 is shaped into a profile 11 by profile rollers 2.1 and hardened at least in certain regions by a hardening device 2.2. The hardening device 2.2 is arranged between two profile rollers 2.1 of the shaping-hardening device 2, so that the hardening of the profile 11 is performed during the shaping process. For the hardening, the profile 11 is first heated into the austenitic range of the material and then quenched. It is preferred that the heating of the profile 11 is performed inductively. Alternatively, the profile 11 may be heated conductively by way of the profile rollers, by way of a naked flame or by contact heat. For hardening, it is necessary to heat the profile 11 to temperatures greater than 850° C. over a period of up to 60 seconds.

In order to protect from corrosion the profile 11 hardened at least in certain regions, those portions of the profile 11 that have emerged from the shaping-hardening device 2 are coated with a protective layer. The coating with the protective layer is performed in a coating device 5 following the shaping-hardening device 2. The shaping-hardening device 2 and the coating device 5 are arranged one behind the other in such a way that the profile 11 is conveyed through the shaping-hardening device 2 and the coating device 5 in the manner of an assembly-line process and thereby shaped, hardened and coated in a continuous run-through process. Consequently, in the production process for profiles 11, a first portion of the profile is coated in the coating device 5 while a second portion of the profile 11 is in the shaping-hardening device 2 and is shaped and hardened there.

The coating of the profile 11 in the coating device 5 may optionally be performed coherently or incoherently. It is thus possible, depending on the intended use of the profile 11 to be produced, to provide protection from corrosion throughout or protection from corrosion in certain portions. For example, it is possible to provide exclusively the cut edges of the profile 11 with a protective layer or to provide exclusively regions of the profile 11 that are particularly at risk of corrosion, known as wet regions, with a protective layer.

It is preferred that the thickness of the protective layer applied to the profile 11 in the coating device 5 is varied from portion to portion, in order to provide portions that are particularly at risk of corrosion with a thicker protective layer than those portions that are less at risk of corrosion.

The coating device 5 may be designed as a depositing and/or spraying-on device. For example, the coating may be performed by depositing from a plasma by means of physical or chemical gas phase deposition, it being possible to create a protective layer with a thickness of below 2 micrometers. Alternatively, the protective layer may be electrolytically deposited in an electroplating operation, it being possible for protective layers of zinc, aluminium or a zinc-nickel alloy to be applied. Furthermore, it is possible to apply the protective layer by flame spraying or to spray zinc flakes on in a spraying process, for example a Cr(VI)-free zinc-flake coating.

It is also possible to apply a protective layer formed as a zinc alloy, for example Zn—Mn, Zn—Cu, Zn—Fe—Ni or Zn—Cu—Ni. Such alloys have a melting point above 700° C., and therefore cannot be applied to the profile 11 in a hot-dip coating process without this leading to a reduction in the hardness and/or the tensile strength of the profile 11.

During the coating with the protective layer it is preferred that nitriding and/or oxidizing of the surface takes place, so that it is not necessary to clean the profile 11 before the coating. In addition, the surface hardness of the profile 11 can be increased in this way.

Figure 2:
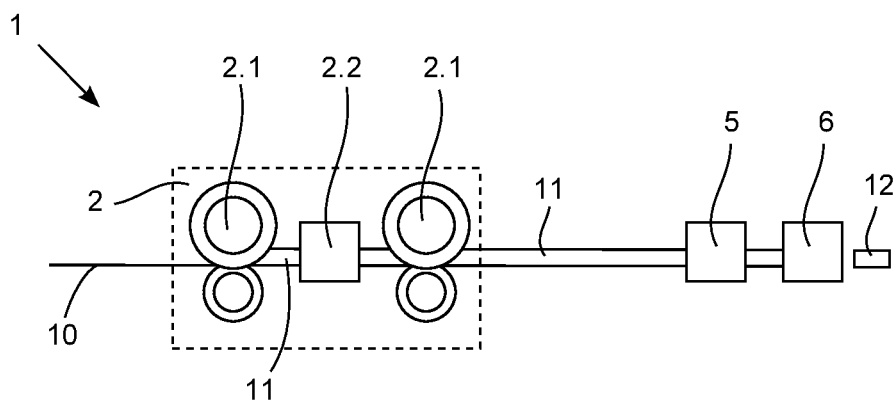
FIG. 2 shows a secondary exemplary embodiment of an apparatus according to the disclosure for producing profiles from metal.

FIG. 2 shows a second exemplary embodiment of an apparatus 1 for producing profiles 11. As a difference from the first exemplary embodiment, the apparatus 1 additionally has a cutting-to-length unit 6, by means of which the coated profile 11 is cut to length into individual profiled components 12. Portions emerging from the coating device 5 are fed to the cutting-to-length unit 6. In the cutting-to-length unit 6 there is performed the separation of the almost continuous profile 11 into individual profiled components 12, which are obtained from portions of the profile 11. Consequently, individual profiled components 12 can be produced by the apparatus, the coating for corrosion protection being applied in a low-cost run-through process before the profiled components 12 are cut to length from the profile 11.

Figure 3:
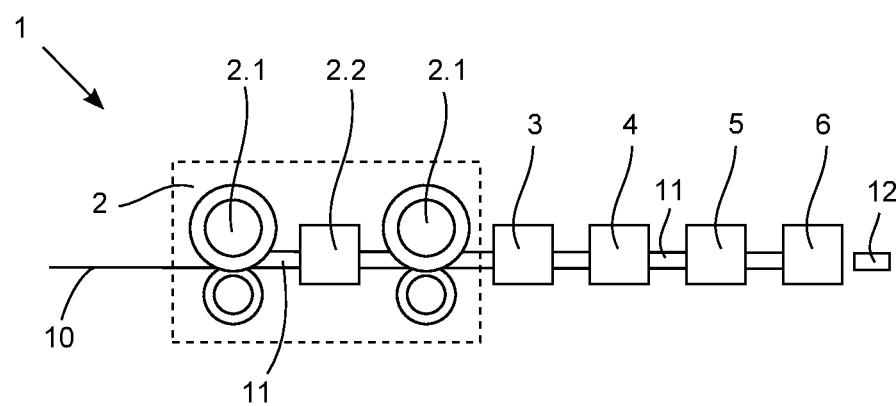
FIG. 3 shows a third exemplary embodiment of an apparatus according to the disclosure for producing profiles from metal.

As a difference from the first two exemplary embodiments, the third exemplary embodiment of a production apparatus 1, shown in FIG. 3, for profiles of metal additionally has a cleaning device 3, arranged between the shaping-hardening device 2 and the coating device 5, and a temperature-adjusting device 4, likewise arranged between the shaping-hardening device 2 and the coating device 5.

In the cleaning device 3, portions of the profile 11 that are emerging from the shaping-hardening device 2 are mechanically and/or chemically cleaned, so that the protective layer applied in the following coating device 5 adheres better to the profile 11. The cleaning device may have brushes and/or a blasting device, by way of which a jet of water, a jet of compressed air or a jet of material is applied to the profile 11. Alternatively or in addition, chemical cleaning may be performed with an alkaline cleaner which comprises alkali hydroxides, alkali carbonates, phosphates, borax, silicates and/or cyanides. For the chemical cleaning, surface-active substances, such as for example surfactants or emulsifiers, and/or inhibitors may be additionally used.

In the temperature-adjusting device 4, arranged between the cleaning device 3 and the coating device 5, the profile 11 is heated up to a temperature in the range between 25° C. and 300° C. By heating up the profile 11 before the coating, the adherence of the protective layer on the profile 11 is improved.

According to a modification of the third exemplary embodiment, the cleaning device 3 is interchanged with the temperature-adjusting device 4, so that the profile 11 emerging from the shaping-hardening device 2 is first fed to the temperature-adjusting device 4 and only then to the cleaning device 3.

With the apparatuses 1 described above, it is possible to realize a process for producing profiles 11 from metal in which a metallic strip material 10 is fed to a shaping-hardening device 2, in which the strip material 10 is shaped into a profile 11 and is hardened at least in certain portions, portions of the profile 11 that are emerging continuously from the shaping-hardening device 2 being coated with a protective layer in order to protect the profile 11 from corrosion.

LIST OF DESIGNATIONS

1 Apparatus for producing profiles
2 Shaping-hardening device
2.1 Profiling roller
2.2 Hardening device
3 Cleaning device
4 Temperature-adjusting device
5 Coating device
6 Cutting-to-length device
10 Strip material
11 Profile
12 Profiled component

What is claimed is:

1. A process for producing profiles from metal, the process comprising:
    shaping a metallic strip material with a shaping-hardening device, in which the strip material is shaped into a profile by a profiling roller;
    hardening the profile during the shaping at least in certain regions;
    emerging portions of the profile continuously from the shaping-hardening device providing a shape hardened profile;
    cleaning the shape hardened profile;
    heating a temperature of the shape hardened profile to a range between 25° C. and 300° C.; and
    subsequent to the temperature adjusting, coating only a first portion of the shape hardened profile with a protective layer so that the shape hardened profile has both coated portions and uncoated portions, wherein the coated first portion of the shape hardened profile is at a lower risk of corrosion as compared to the uncoated portions.

2. The process according to claim 1 wherein the coating is performed in a coating device while a second portion of the profile is in the shaping-hardening device.

3. The process according to claim 2 wherein the metallic strip of material has cut edges; and wherein coating only the first portion of the shape hardened profile comprises coating exclusively the cut edges of the shaped hardened profile.

4. The process according to claim 2, further comprising:
    varying a thickness of the protective layer in the first portion.

5. The process according to claim 4 wherein the coating is performed by one of depositing or spraying on the protective layer.

6. The process according to claim 1
    wherein the hardening comprises heating the profile one of inductively, conductively, with a naked flame or by contact heat.

7. The process according to claim 1, further comprising:
    cutting the profile to length into individual profiled components after the coating.

8. The process of claim 1 wherein producing profiles comprises producing one of structural profiles and safety profiles.

9. The process of claim 8 wherein the profiles comprise motor vehicle profiles.

10. A process for producing profiles from metal, the process comprising:

shaping a metallic strip into a profile by a profiling roller in a shaping-hardening device;

hardening the profile during the shaping at least in certain regions;

emerging portions of the profile continuously from the profiling roller providing a shape hardened profile;

cleaning the shape hardened profile;

heating a temperature of the shape hardened profile to a range between 25° C. and 300° C.; and subsequent to the temperature adjusting, coating only a first portion of the shape hardened profile with a protective layer so that the shape hardened profile has both coated portions and uncoated portions, wherein the protective layer further defines varying thickness including a thicker protective layer at portions of the protective layer particularly at risk of corrosion as compared to other portions of the protective layer less at risk of corrosion.

11. The process according to claim 10 wherein the coating is performed by one of depositing or spraying on the protective layer.

12. The process of claim 10 wherein producing profiles comprises producing one of structural profiles and safety profiles.

13. The process of claim 12 wherein the profiles comprise motor vehicle profiles.

* * * * *